United States Patent
Johnson

(10) Patent No.: US 9,455,213 B2
(45) Date of Patent: Sep. 27, 2016

(54) ARCHITECTURE FOR GAS COOLED PARALLEL MICROCHANNEL ARRAY COOLER

(75) Inventor: Scott T. Johnson, Torrance, CA (US)

(73) Assignee: RAYTHEON COMPANY, Waltham, MA (US)

( * ) Notice: Subject to any disclaimer, the term of this patent is extended or adjusted under 35 U.S.C. 154(b) by 1012 days.

(21) Appl. No.: 12/870,651

(22) Filed: Aug. 27, 2010

(65) Prior Publication Data

US 2011/0048689 A1    Mar. 3, 2011

Related U.S. Application Data

(60) Provisional application No. 61/238,096, filed on Aug. 28, 2009.

(51) Int. Cl.
| | |
|---|---|
| *F28F 7/00* | (2006.01) |
| *H01L 23/467* | (2006.01) |
| *H01L 23/46* | (2006.01) |
| *H01L 23/433* | (2006.01) |
| *H05K 7/20* | (2006.01) |

(52) U.S. Cl.
CPC ......... *H01L 23/467* (2013.01); *H01L 23/4336* (2013.01); *H01L 23/46* (2013.01); *H01L 2924/0002* (2013.01); *H05K 7/20136* (2013.01)

(58) Field of Classification Search
CPC . H01L 23/467; H01L 23/3672; H01L 23/46; F28F 9/0224; F28D 7/16; H01C 1/082; H05K 7/20009; H05K 7/20136
USPC .......................... 165/80.3, 173, 185; 361/689
See application file for complete search history.

(56) References Cited

U.S. PATENT DOCUMENTS

| | | | |
|---|---|---|---|
| 5,132,780 A * | 7/1992 | Higgins, III | 257/722 |
| 5,592,363 A * | 1/1997 | Atarashi et al. | 361/689 |
| 5,705,854 A | 1/1998 | Atarashi et al. | |
| 6,263,955 B1 * | 7/2001 | Azar | 165/80.3 |
| 6,842,340 B2 | 1/2005 | Chang | |
| 2004/0045701 A1 * | 3/2004 | Chen et al. | 165/185 |
| 2006/0162340 A1 | 7/2006 | Kuo | |
| 2007/0081888 A1 | 4/2007 | Harrison | |
| 2008/0198896 A1 | 8/2008 | Nair | |

FOREIGN PATENT DOCUMENTS

JP    2007-005685 A    1/2007

OTHER PUBLICATIONS

Merriam-webster notch definition.*

(Continued)

*Primary Examiner* — Marc Norman
*Assistant Examiner* — Jon T Schermerhorn
(74) *Attorney, Agent, or Firm* — Lewis Roca Rothgerber Christie LLP

(57) ABSTRACT

Effective utilization of a parallel flow air-cooled microchannel array at the micro electro mechanical systems (MEMS) scale is prohibited by unfavorable flow patterns in simple rectangular arrays. The primary problem encountered is the inability of the flow stream to penetrate a sufficient depth into the fin core to achieve the desired fin efficiency. Embodiments of the present invention overcome this problem using a manifold with open nozzle discharge and integrated lateral exhaust along with a microchannel array cooler with micro spreading cavities for internal air distribution.

14 Claims, 12 Drawing Sheets

(56) References Cited

OTHER PUBLICATIONS

Written Opinion of the International Searching Authority for International Application No. PCT/US2010/0470454, filed Aug. 27, 2010, Written Opinion dated May 25, 2011 and mailed Jun. 6, 2011 (5 pgs.).

International Search Report for International Application No. PCT/US2010/0470454, filed Aug. 27, 2010, International Search Report dated May 25, 2011 and mailed Jun. 6, 2011 (4 pgs.).

Examination Report mailed Apr. 21, 2016 for corresponding European Application No. 10759756,9, filed Aug. 27, 2010 (6 pgs.).

* cited by examiner

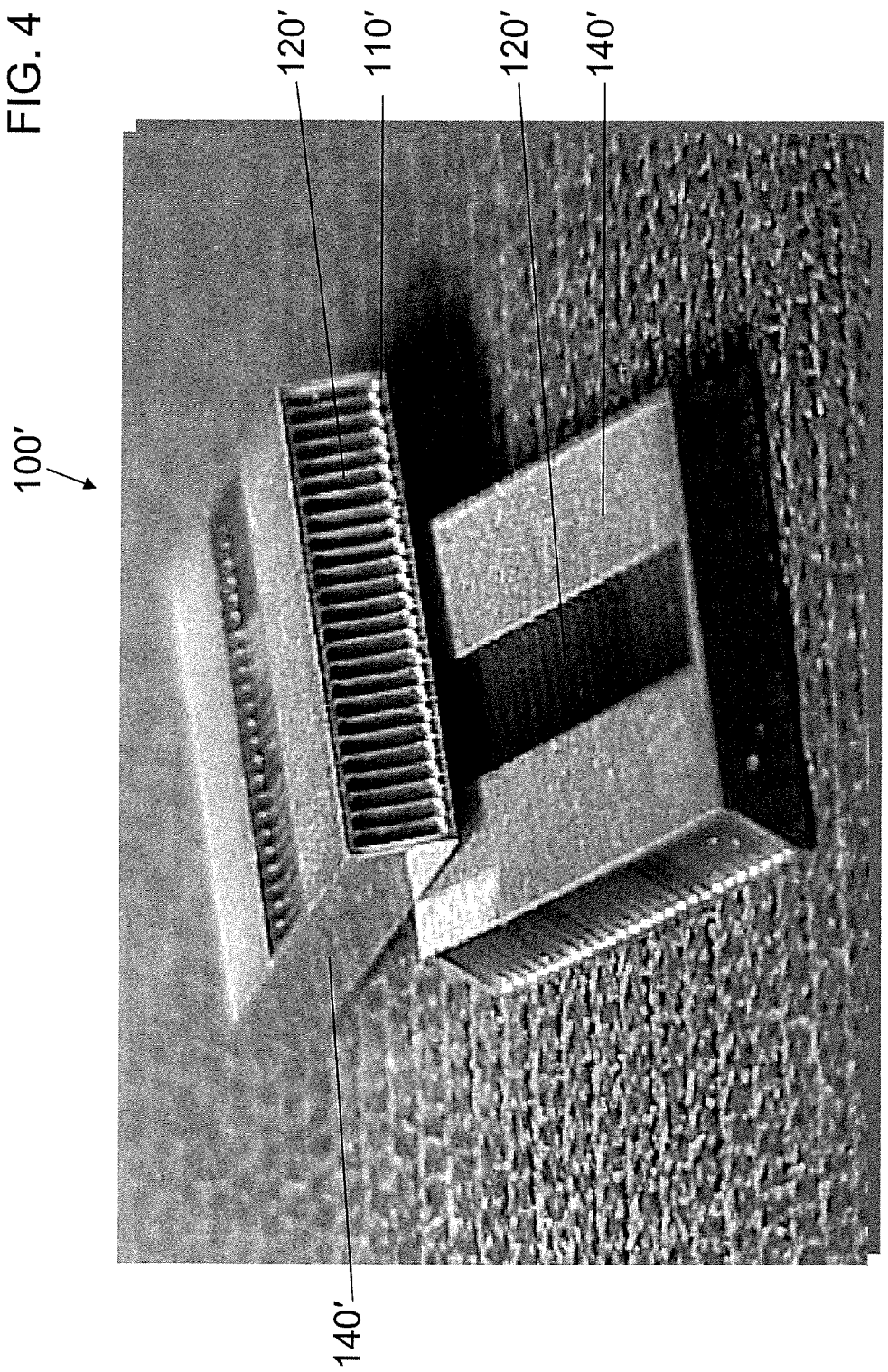

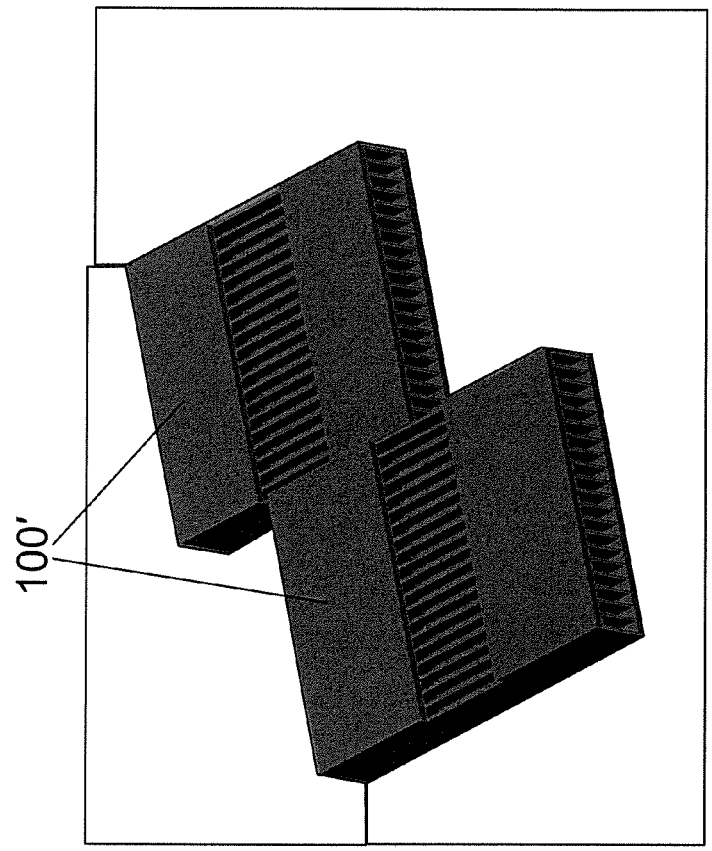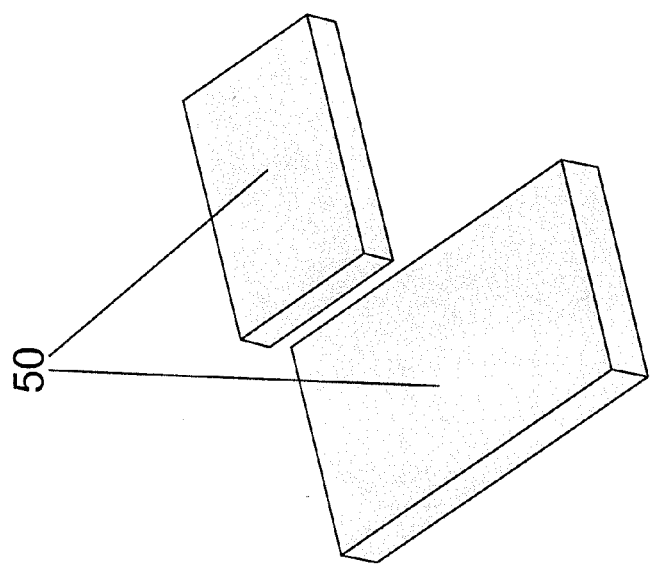

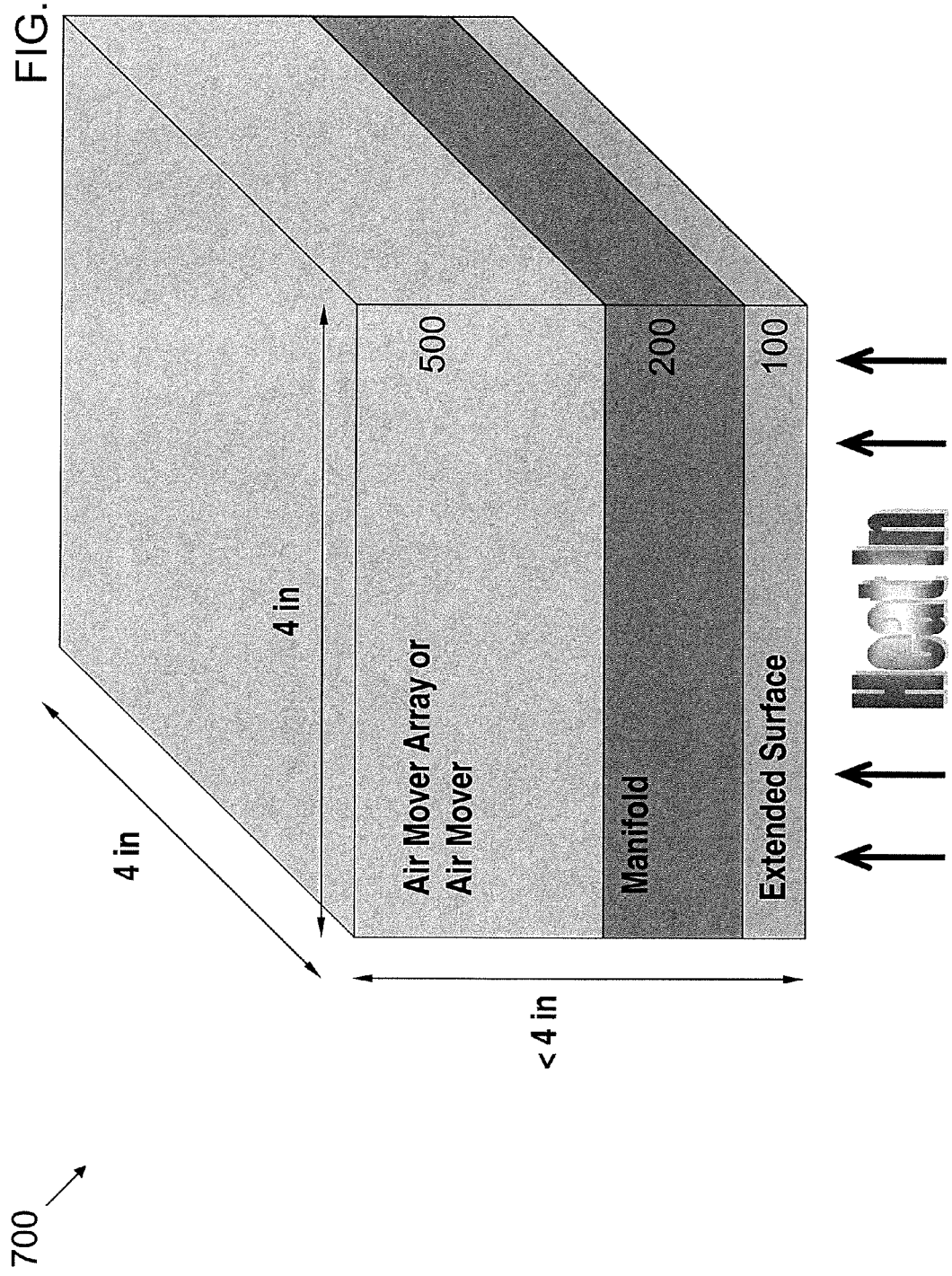

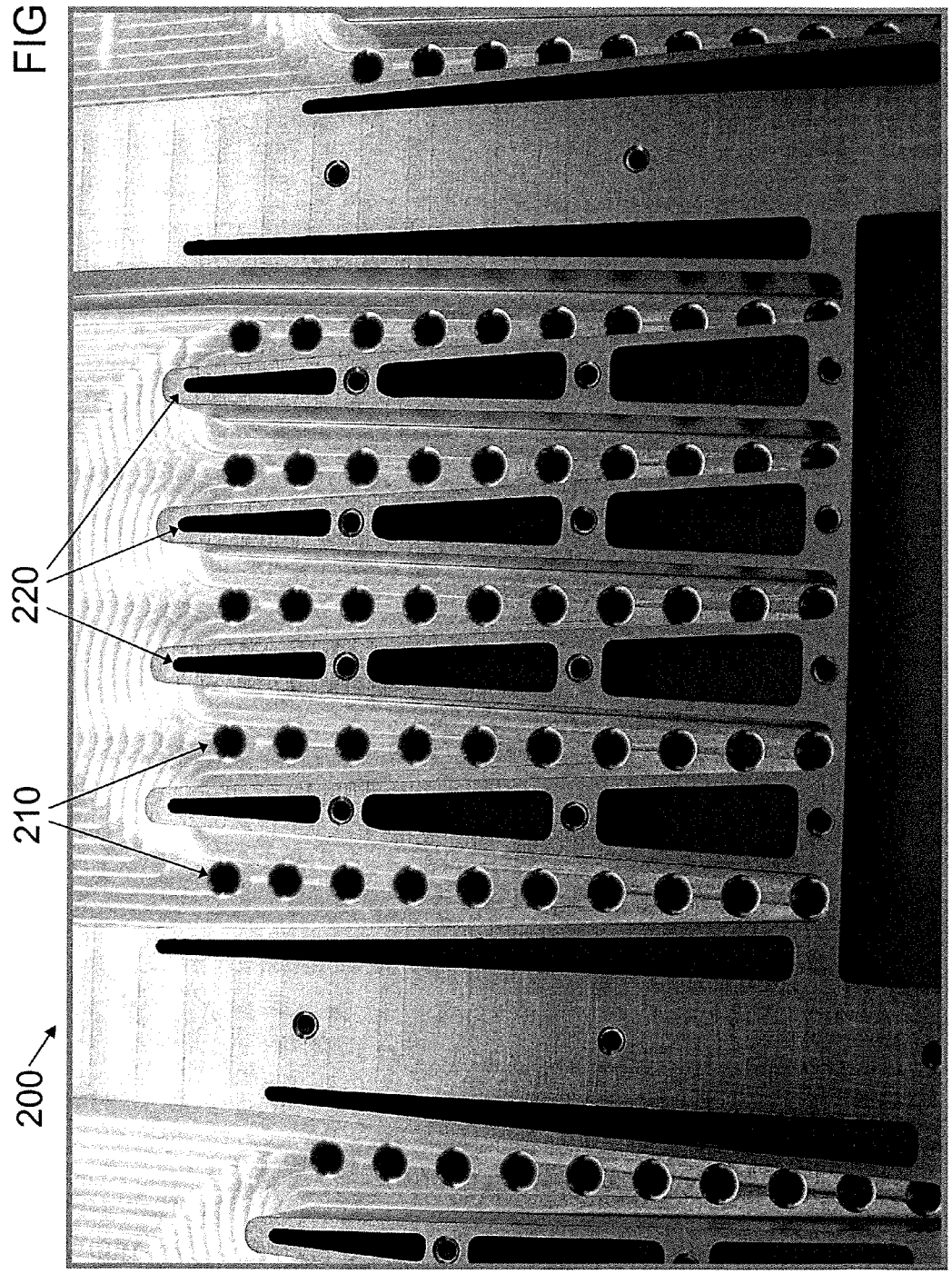

ARCHITECTURE FOR GAS COOLED PARALLEL MICROCHANNEL ARRAY COOLER

CROSS-REFERENCE TO RELATED APPLICATION(S)

This application claims priority to and the benefit of U.S. Provisional Patent Application No. 61/238,096, entitled "Architecture for Gas Cooled Parallel Microchannel Array Cooler," filed on Aug. 28, 2009 in the U.S. Patent and Trademark Office, the entire content of which is herein incorporated by reference.

BACKGROUND

1. Field

Aspects of embodiments of the present invention relate to cooling systems. More specifically, aspects of embodiments of the present invention relate to microchannel heat sink cooling systems.

2. Description of Related Art

Modern electronics, such as computer processor chips, are capable of generating enormous amounts of heat in a small amount of space. Cooling such components can present many design challenges. Environmental factors can further complicate design considerations. For instance, on military aircraft, where the size, weight, power consumption, and durability of any hardware (such as cooling systems) are factors, features such as small size, light weight, low power consumption, and rugged design are benefits. Air cooling is especially attractive on such platforms. Otherwise, fuel or another fluid that can serve as a coolant must be routed or configured in such a fashion as to remove the heat.

Two examples of cooling systems for electronics and other heat sources include microchannel heat sinks and jet impingement cooling. With microchannel heat sinks, coolant (for example, air) is directed between microchannels, that is, narrow openings between closely spaced surfaces (for example, thin fins of metal) that are heated from the electronics. Microchannel heat sinks rely on the large surface area exposed to the coolant to dissipate the heat. Sufficient coolant pressure must be present to carry away heat from the surface area via the microchannel. Jet impingement cooling, on the other hand, uses narrow high-speed jets of coolant directed at the heat source, causing rapid cooling, limited primarily to the region receiving the direct impact of the jets. Microchannel heat sinks can suffer from insufficient coolant pressure to dissipate the heat from the large surface area while jet impingement cooling can suffer from the somewhat localized area of heat rejection.

Effective air cooled microchannel arrays with parallel flow on a micro electro mechanical systems (MEMS) scale, however, is prohibited by unfavorable flow patterns in simple rectangular arrays of fins. The primary problem encountered is the inability of the flow stream to penetrate a sufficient depth into the fin core to achieve the desired fin efficiency.

Thus, there is a need for a compact, air-cooled, microchannel heat sink with a favorable flow pattern that uses minimal air mover power and minimal flow rate.

SUMMARY

Embodiments of the present invention reduce or overcome these problems using a separate manifold structure to deliver cool air and exhaust warm air, combined with a microchannel array cooler that uses micro-plenums (spreading cavities) integrated into the microchannel core, which allows segregated circular or slot nozzle delivered airflow jets to distribute into the microchannel core to achieve maximum core performance. This allows a compact design to reject a large amount of heat with minimal pressure drop. In addition, the separate manifold is isolated from direct contact with the cooler, leading to a lower flow resistance design that requires less air mover power without a reduction in thermal performance.

Designing the cool air delivery passages (or channels) in the manifold in a complementary sawtooth pattern with the warm air exhaust passages improves both cool air delivery through nozzles in the manifold and warm air exhaustion through openings in the manifold. Power consumption can be kept low by using an array of small fans to provide the airflow. Such a system is capable of rejecting a large amount of heat in a small amount of space using minimal air mover electrical power. In addition, the system is capable of using ambient air as the coolant. Also, the manifold and cooler can be made of durable components that do not need to maintain physical contact, thus greatly reducing the risk of damage from shock or vibration.

In an exemplary embodiment according to the present invention, a parallel microchannel array cooler is provided. The cooler is for cooling a heat source with a gas that is cooler than the heat source. The cooler includes a base and one or more rows in a widthwise direction. The base is for transferring heat from the heat source. Each of the one or more rows includes fins in a lengthwise direction and a micro-plenum in the lengthwise direction. The fins are separated by microchannels. The fins are for dissipating the heat from the base. The micro-plenum is for dispersing the gas to the fins via the microchannels. The gas is for transferring the heat from the fins.

The cooler may further include a structural cap for protecting the fins from handling damage.

The cooler may be monolithic.

The fins may include notches such that adjacent rows of the one or more rows include V-grooves in the lengthwise direction between the adjacent rows. The V-grooves are for facilitating removing of the heated gas from the cooler.

The one or more rows may include a plurality of rows.

In another exemplary embodiment according to the present invention, a gas cooling device is provided. The gas cooling device is for cooling a heat source with a gas that is cooler than the heat source. The gas cooling device includes a parallel microchannel array cooler and a manifold. The cooler includes a base and one or more rows in a widthwise direction. The base is for transferring heat from the heat source. Each of the one or more rows includes fins in a lengthwise direction and a micro-plenum in the lengthwise direction. The fins are separated by microchannels. The fins are for dissipating the heat from the base. The micro-plenum is for dispersing the gas to the fins via the microchannels. The gas is for transferring the heat from the fins. The manifold includes nozzles and openings. The nozzles are for delivering jets of the gas to the cooler. Each of the nozzles is for delivering one of the jets to a corresponding receiving point in the micro-plenum of one of the one or more rows. The openings are for removing the gas delivered to the cooler. The manifold is separated from the cooler by a fixed distance.

The jets may be substantially parallel to one another.

The fixed distance may be between about 25 mils and about 100 mils.

The gas may be air.

The cooler further may further include a structural cap for protecting the fins from handling damage.

The cooler may be monolithic.

The fins may include notches such that adjacent rows of the one or more rows include V-grooves in the lengthwise direction between the adjacent rows. The V-grooves are for facilitating the removing of the heated gas from the cooler via the openings.

The V-grooves may correspond to the openings.

The gas cooling device may further include a plurality of coolers.

The one or more rows may include a plurality of rows.

The manifold may further include a first set of nozzles and a second set of nozzles. The first set of channels is for delivering the gas to the nozzles. The second set of channels is for removing the gas from the openings. The first set of channels and the second set of channels may be in a complementary sawtooth arrangement.

In yet another exemplary embodiment according to the present invention, an air cooling system is provided. The system is for cooling a heat source with air. The system includes a parallel microchannel array cooler, manifold, and an air mover. The parallel microchannel array cooler includes a base and one or more rows in a widthwise direction. The base is for transferring heat from the heat source. Each of the one or more rows includes fins in a lengthwise direction and a micro-plenum in the lengthwise direction. The fins are separated by microchannels. The fins are for dissipating the heat from the base. The micro-plenum is for dispersing the air to the fins via the microchannels. The air is for transferring the heat from the fins. The manifold includes nozzles and openings. The nozzles are for delivering jets of air to the cooler. Each of the nozzles is for delivering one of the jets to a corresponding receiving point in the micro-plenum of one of the one or more rows. The openings are for removing the air delivered to the cooler. The air mover is for delivering the air to the manifold. The manifold is separated from the cooler by a fixed distance.

The fixed distance may be between about 25 mils and about 100 mils.

The air cooling system may further include a debris screen between the air system and the manifold.

The debris screen may be configured to improve distribution of an airflow.

The air mover may include a fan or an array of small fans.

The cooler may further include a structural cap for protecting the fins from handling damage.

The fins may include notches such that adjacent rows of the one or more rows include V-grooves in the lengthwise direction between the adjacent rows. The V-grooves are for facilitating the removing of the heated gas from the cooler via the openings.

The manifold may further include a first set of channels and a second set of channels. The first set of channels is for delivering the air to the nozzles. The second set of channels is for removing the air from the openings. The first set of channels and the second set of channels may be in a complementary sawtooth arrangement.

BRIEF DESCRIPTION OF THE DRAWINGS

The accompanying drawings illustrate embodiments of the present invention and, together with the description, serve to explain the principles of embodiments of the present invention.

FIG. 4 depicts a pair of parallel microchannel array coolers according to another exemplary embodiment of the present invention.

FIG. 5, which includes FIGS. 5A and 5B, shows the exemplary coolers of FIG. 4 deployed on example heat sources.

FIG. 8 illustrates an example configuration of components of the air cooling system of FIG. 6.

FIG. 9 is a top view of a manifold according to an exemplary embodiment of the present invention.

FIG. 10, which includes

DETAILED DESCRIPTION

Figure 1:
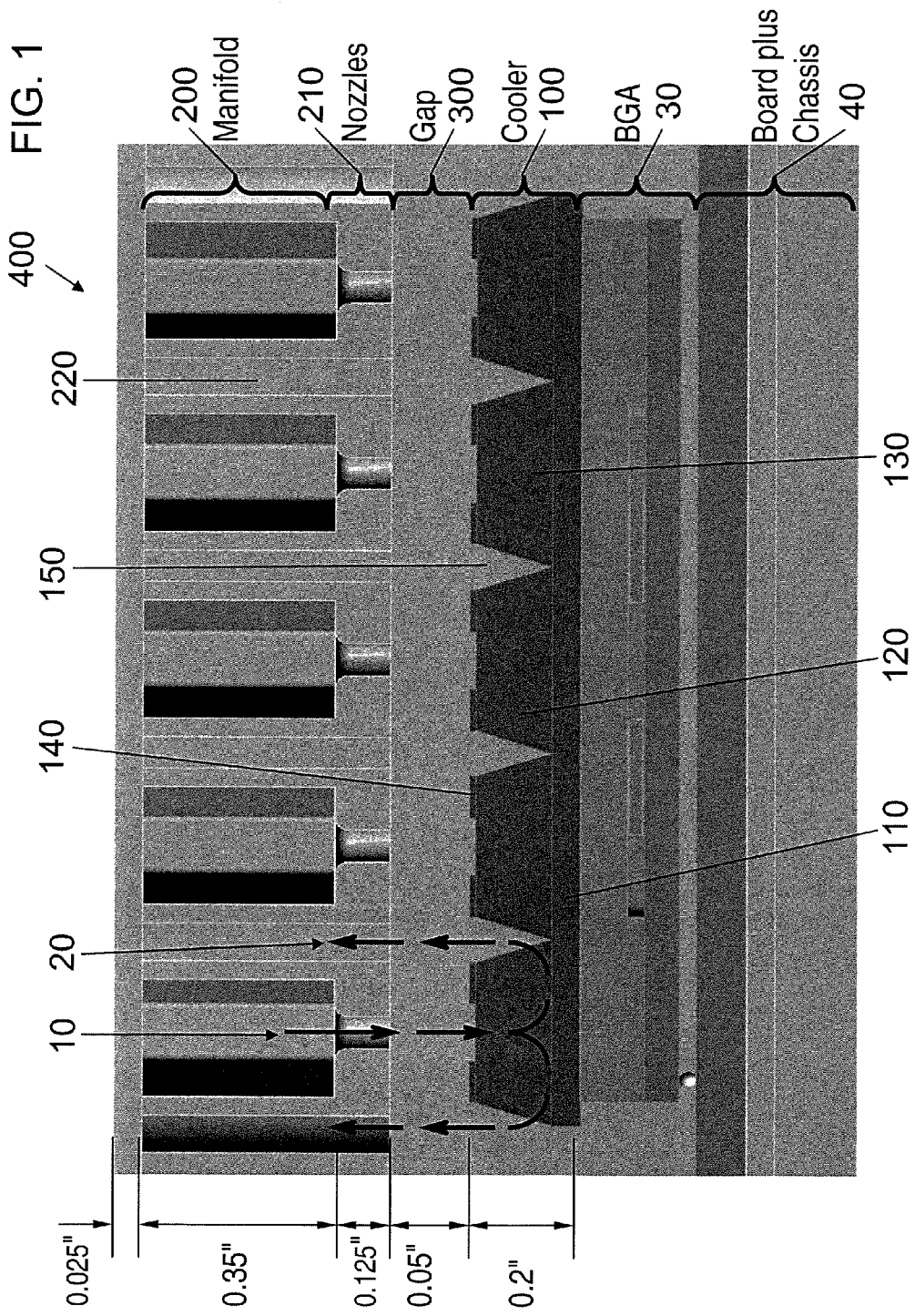
FIG. 1 is a side view of a parallel microchannel array cooling device according to an exemplary embodiment of the present invention.

Exemplary embodiments of the present invention will now be described in more detail with reference to the accompanying drawings. In the drawings, like reference numerals refer to like elements throughout.

Referring now to FIG. 1, in a side view (i.e., a widthwise view) of an exemplary embodiment of the present invention, an air-cooled parallel microchannel array cooling device 400 is shown attached to an example heat source, in this case a ball grid array (BGA) 30 mounted on a circuit board with chassis 40. The heat source can be anything, electronics or otherwise. While this particular cooling device uses air with which to cool, the present invention is not limited thereto. For instance, any gas may serve as a cooling medium. For purposes of this disclosure, therefore, air will serve as an example cooling gas.

The cooling device 400 includes a parallel microchannel array cooler 100 and a manifold 200. The cooler 100 includes a base 110 attached to the heat source (i.e., the BGA 30 in FIG. 1). The heat source transfers heat to the base 110 through conduction. The base 110 supports five rows (in this example) in the widthwise direction, each of the rows including densely packed thin fins 120 arranged in a lengthwise direction. Each pair of (lengthwise) adjacent fins 120 is separated by a microchannel (hence, a microchannel array configuration). Much of the heat transferred to the base then transfers to the fins 120 through conduction. The cooler 100 can be monolithic (single piece) in construction, or multiple coolers can be used. The microchannel array can be built, for example, by diffusion bonding precision etched thin metal sheets or foils.

The manifold 200 includes nozzles 210 (five of which are visible in FIG. 1, at least from this side view) that are configured to divide up a flow rate of air into multiple parallel (or substantially parallel) high-speed flows (jets) of air to receiving points on the cooler 100, as illustrated by the blue arrows 10, representing cool air. For example, a 2-inch-by-2-inch manifold design might break up the airflow into 50 separate jets. The incoming airflow can come from any source, such as a fan array or an air scoop. It should be noted that the manifold 200 and cooler 100 can be of comparable surface areas in some embodiments, while in other embodiments, the manifold may exchange air with numerous coolers, which can be in a variety of arrangements (for example, in an array of contiguous coolers, a separated collection of coolers, or a combination of contiguous and separated coolers).

The air jets cross a gap 300 of a distance (for example, a fixed distance, which in the embodiment of FIG. 1, is 50 mils) to reach the cooler 100. The gap 300 can vary from this size, say from 25 mils to 100 mils, but should be small enough that the air jets 10 do not lose pressure or are deflected, yet not too small that the manifold 200 risks impacting the cooler 100. From there, the air jets 10 reach a micro-plenum 130, also known as a cavity or spreading cavity, which distributes the air (in the lengthwise direction) throughout the row. A structural cap 140, extending in the lengthwise direction along both sides of the tops of the fins 120 as well as on both ends of the row, helps protect the fins 120 from handling damage and also helps direct the airflow through the micro-plenum 130 and out the sides of the row through the microchannels. The thickness of the structural cap 140 is significantly greater than that of the fins 120. In some embodiments, the base 110 and the structural cap 140 may be one piece.

In order for the microchannel cooler 100 to reach its peak efficiency, the air should be delivered to each individual microchannel. The micro-plenum 130 (and, to a lesser extent, the structural cap 140) allows the cooler 100 to achieve this goal by evenly distributing the cooling air, which is delivered as jets of cooling air from the manifold 200 to receiving points of the cooler corresponding to the micro-plenum 130. The air escapes from the cooler 100 via the microchannels, which dissipates heat from the fins 120 in the process, and returns to openings 220 in the manifold 200 (as illustrated by the red arrows 20, representing warm air).

In the exemplary embodiment of FIG. 1, the fins 120 are notched at their sides to form V-grooves 150 at the edges of adjacent rows, which extend in the lengthwise direction. These V-grooves 150 facilitate air to escape to the openings 220 in the manifold 200, especially in tight assemblies. The structural cap 140 helps further direct the airflow to the V-grooves 150. The V-grooves 150 are optional. In other embodiments, they may not be included or may take on an alternate shape.

FIG. 1 also shows example lengths and heights for some of the features. For instance, the fins 120 have a height of 0.2 inch, while the nozzles 210 have a length of 0.125 inch and the rest of the manifold has a height of 0.35 inch. The gap 300 between the nozzles and the cooler 100 is 0.05 inch (50 mils).

Figure 2:
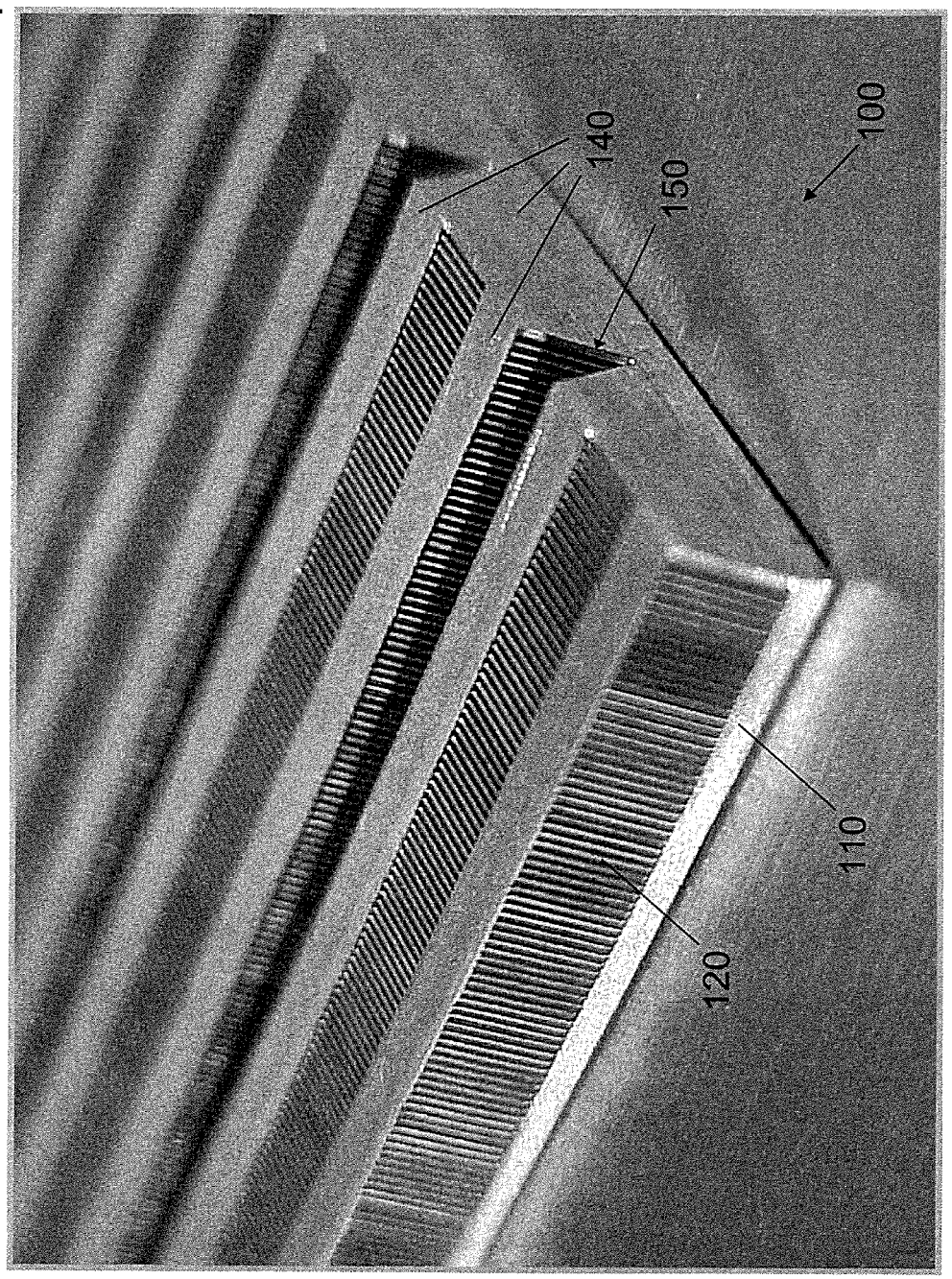
FIG. 2 is an oblique view of a parallel microchannel array cooler according to an exemplary embodiment of the present invention.

FIG. 2 depicts an oblique view of a parallel microchannel array cooler 100 according to an exemplary embodiment of the present invention. The cooler 100 includes a base 110 configured to transfer heat from a heat source (for example, a high-power processor or other electronics). Attached to the base are a set of very thin fins 120 (for example, 2 mils thick) arranged in rows and densely spaced (for example, 80 to 100 fins per inch, in the lengthwise direction) to form corresponding microchannels between the fins (for example, microchannel widths of 8 to 10.5 mils). Adjacent microchannels (that is, sharing a same fin) are substantially parallel, as are there corresponding fins. Thinner fins can allow fin densities as high as 500 fins per inch to be realized. The fins 120 are configured to dissipate heat from the base 110 with the help of rapidly moving air flowing between the microchannels via a micro-plenum (see FIGS. 1 and 3-4).

Structural cap 140 extends up the ends of the rows and along the tops of the rows of fins 120. The structural cap 140 helps protect the fins 120 from damage during handling as well as helps direct the airflow along the micro-plenum, through the microchannels, and out the sides of the rows. V-grooves 150 at the edges of the rows further facilitate heat dissipation from the fins 120.

Figure 3:
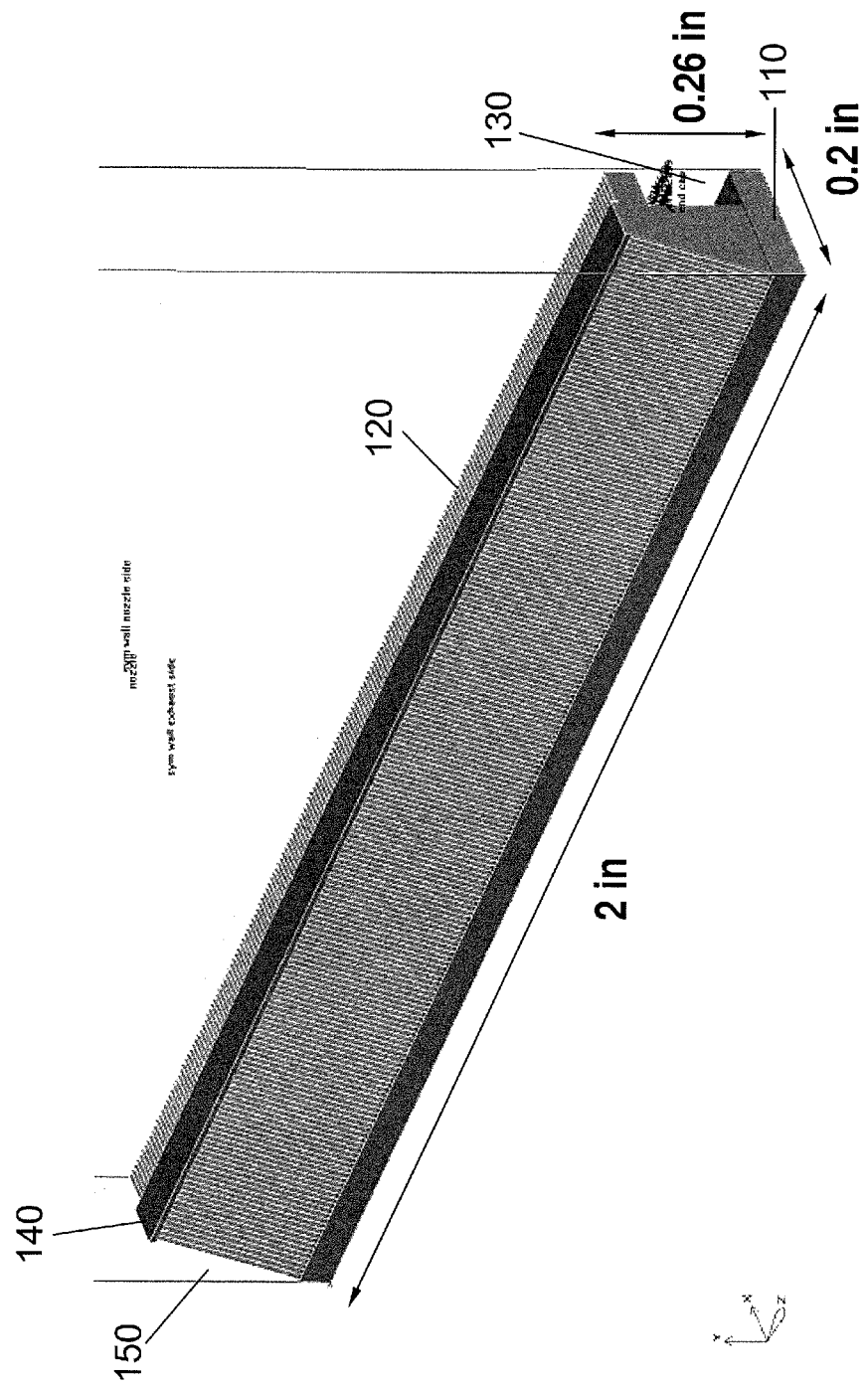
FIG. 3 is a cutaway view of half of a microchannel array cooler row according to an exemplary embodiment of the present invention.

FIG. 3 shows a cutaway view of half of a microchannel array cooler row according to an exemplary embodiment of the present invention. Micro-plenum 130 can be seen formed between the fins 120 and the base 110. The top portion of the structural cap 140 can be seen extending along the tops of the fins 120. Half of a V-groove 150 can be seen in the notched side of the row of fins 120. Example dimensions are also provided. For example, the row length is 2 inches, while half the row width is 0.2 inches (i.e., 0.4 inches of width per row, or 5 rows every 2 inches), and the cooler height (fins 120 plus base 110) is 0.26 inches.

FIG. 4 depicts a pair of parallel microchannel array coolers 100' according to another exemplary embodiment of the present invention. Each cooler 100' includes a base 110' with a single row of fins 120' between which are the parallel microchannels. The exemplary coolers 100' are smaller than those depicted earlier. For instance, each cooler 100' is 0.3 inches×0.3 inches×0.07 inches high, with 80 fins per inch in an example configuration. The fins 120 are constructed, for example, using a diffusion bonded foil process.

FIG. 5, which includes FIGS. 5A and 5B, shows the exemplary coolers 100' of FIG. 4 deployed on example heat sources 50, which in this example illustration are computer chips. Such computer chips 50 can include, for example, gallium arsenide chips or silicon germanium chips. FIG. 5A depicts the chips 50 before placement of the coolers 100', while FIG. 5B depicts the chips 50 with the coolers 100' deployed on them.

Figure 6:
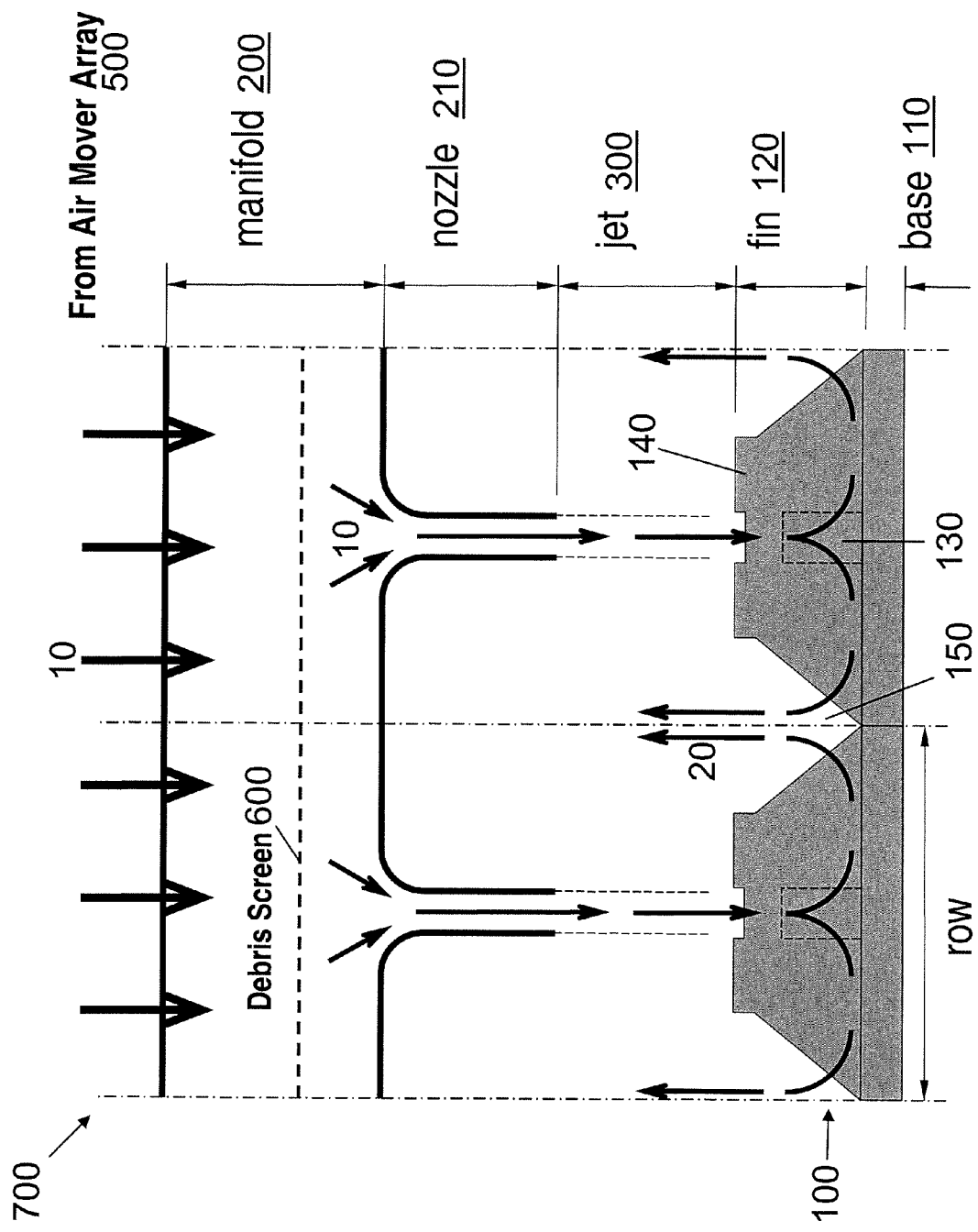
FIG. 6 depicts the operation of a microchannel air cooling system according to an exemplary embodiment of the present invention.

FIG. 6 illustrates the operation of a microchannel air cooling system 700 according to an exemplary embodiment of the present invention. In addition to previously described cooler 100 (including base 110, fins 120, micro-plenums 130, structural cap 140, and V-grooves 150) and manifold 200 (with nozzles 210), air cooling system 700 also includes an air mover array 500 of small fans and a debris screen 600. The air mover array 500 includes several small fans configured to deliver sufficient air to the manifold to realize the air-cooling potential of the array.

Figure 7:
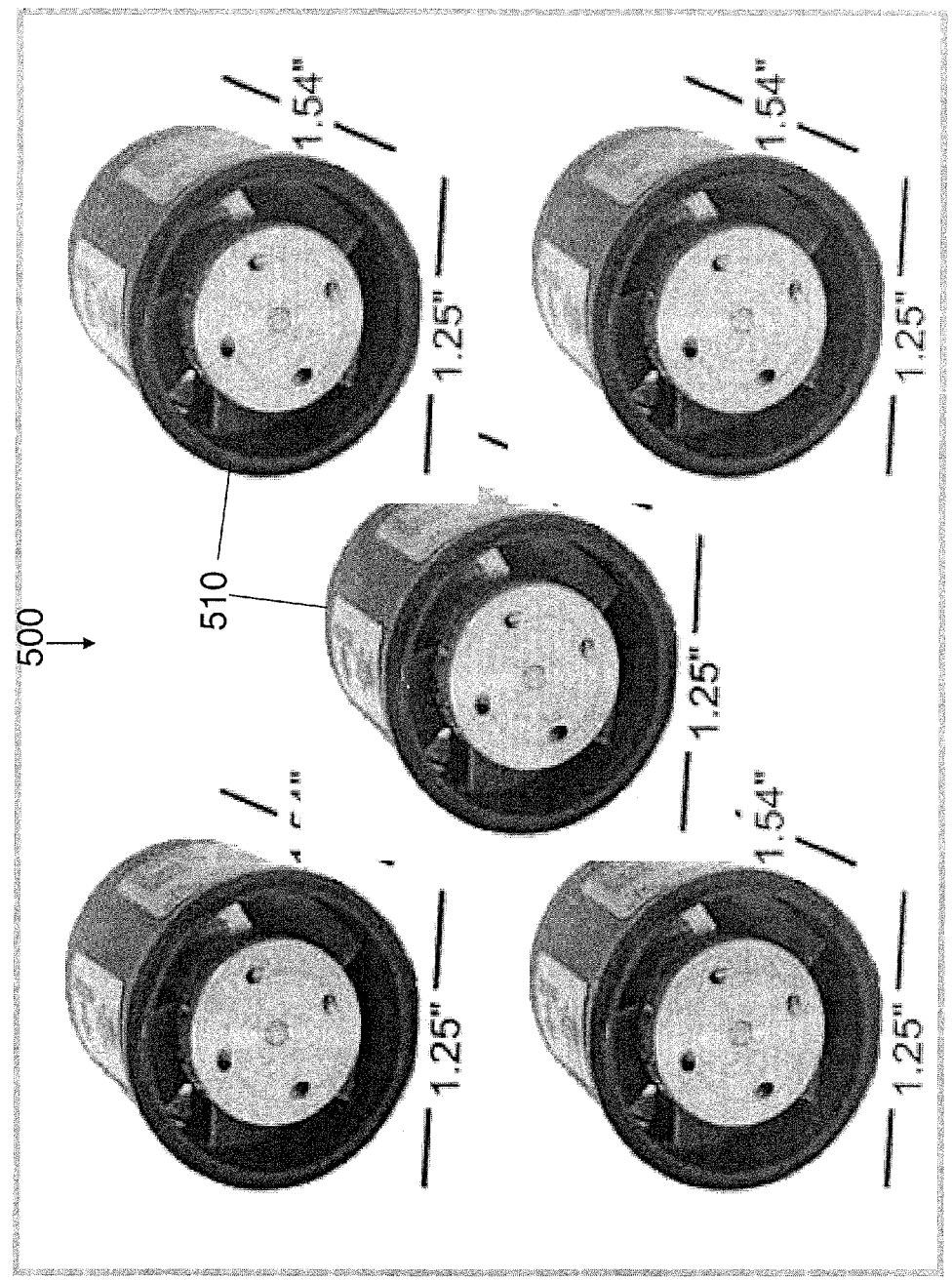
FIG. 7 shows an example small fan array suitable for use with the air cooling system of FIG. 6.

For instance, FIG. 7 shows an example five-fan array 500 designed to deliver 50 cubic feet of air per minute (CFM) using no more than 33 watts (W) of power for a 4 inch square cooling system. Each individual cylindrical-shaped fan 510 in FIG. 7 has a diameter of 1.25 inches, allowing three such fans to fit across in 4 inches of space. Thus, in the offset pattern shown in FIG. 7, five such fans 510 can fit in a 4 inch by 4 inch area with sufficient space between each pair of fans. The system is capable of rejecting 1000 W of heat with no more than 0.05 degrees Celsius (C) per watt of heat dissipated (i.e., no more than 50° C. total rise in temperature to reject 1000 W of heat). This measurement of efficiency is also known as thermal resistance or C/W. Such efficiency is an order of magnitude better than conventional systems. The entire package fits in a 4-inch cube, as shown in FIG. 8, which depicts the cooler 100, manifold 200, and air mover 500 in an exemplary configuration of an air cooling system 700.

Another measurement of cooling performance is the system coefficient of performance, which compares the heat (in watts) dissipated compared to the power (in watts) used to dissipate the heat. In the above example, the system coefficient is 1000 W/33 W=30.

The debris screen 600 (see FIG. 6) helps prevent sufficiently large objects from entering the cooling device and potentially clogging the microchannels or other air passages of the cooler 100 or manifold 200. In addition, the debris screen 600 can be configured to help smooth the airflow, directing it more efficiently to the nozzles 210. As can be seen in FIG. 6, cool or ambient air 10 is delivered from the air mover array 500. It flows through the manifold 200 and debris screen 600, eventually being directed to nozzles 210 of sufficiently narrow diameter (or slot width in the case of rectangular or slot nozzles) to break up the airflow into numerous high-speed jets of air directed at specific points on the cooler 100, depicted by the blue arrows 10. More specifically, the jets are directed to the surface of the base 110.

The high-speed jets of air do some jet impingement cooling when they hit the base 110. In addition, the micro-plenums 130 disperse the high-speed airflow from the specific points throughout the cooler 100 and into the microchannels between the fins 120. This dissipates heat from the fins 120 via microchannel heat sink cooling. The pressure is maintained by the return airflow, carrying the warm air 20 back to separate openings in the manifold 200 configured for that purpose, depicted by the red arrows 20 in FIG. 6. V-grooves 150 help with the return airflow, providing channels for the warm air to escape from the cooler 100.

FIG. 9 is a top view of a manifold 200 according to an exemplary embodiment of the present invention. The manifold 200 has 50 nozzles 210 for directing jets of air at the cooler. The nozzles 210 are arranged in five rows of 10 evenly spaced equal-sized nozzles apiece. In addition, the manifold has 14 openings 220 for returning warm air that has passed through the cooler. The openings 220 are arranged in four rows of three differently sized openings between the rows of nozzles, and a single opening at each side of the manifold 200. The openings thus correspond to the V-grooves of the cooler while the nozzles correspond to the micro-plenums when the manifold 200 and the cooler are brought together to function as a cooling device. In addition, FIG. 9 depicts a counter-tapering ("sawtooth") design, where nozzle 210 paths taper one direction while opening 220 paths taper the opposite direction, which helps maintain an even pressure and flow distribution that is beneficial to the cooler performance.

Figure 10A:
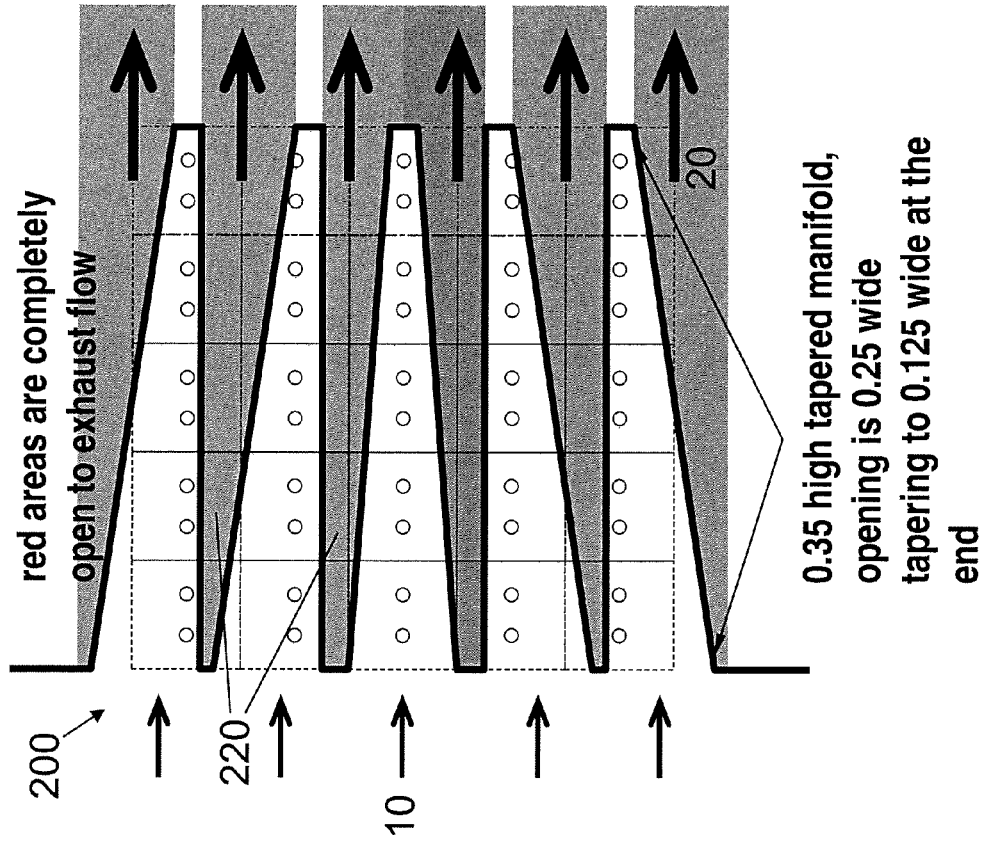
FIGS. 10A and 10B, shows the nozzle and opening layout, the airflow, and the tapering air channels of the manifold depicted in FIG. 9.
Figure 10B:
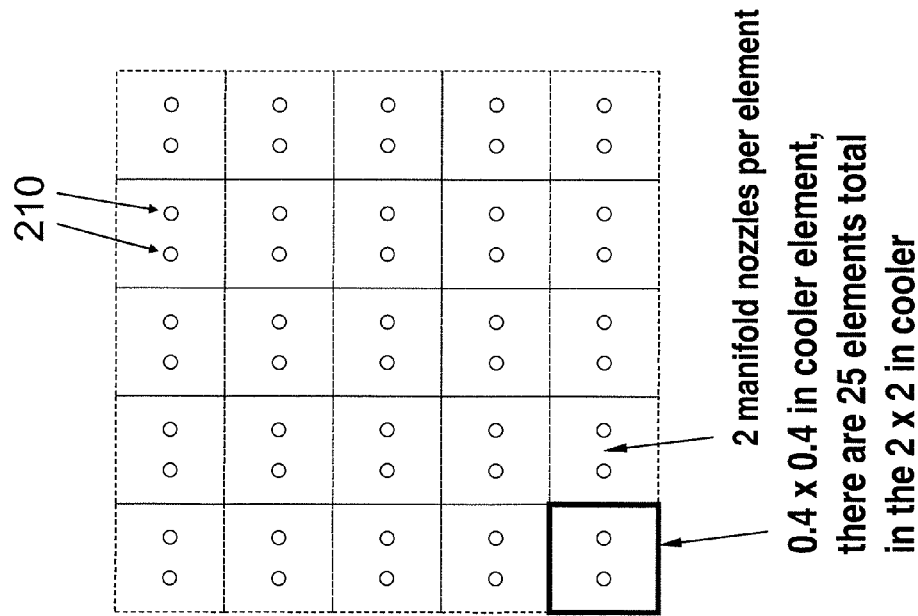

FIG. 10, which includes FIGS. 10A and 10B, shows the nozzle and opening layout, the airflow, and the tapering air channels of the manifold 200 depicted in FIG. 9. FIG. 10A shows the layout of nozzles 210, while FIG. 10B adds the openings 220 and illustrates the corresponding airflows. As can be seen in the exemplary design of FIG. 10A, 25 cooler elements or "cells," each of dimensions 0.4 inch by 0.4 inch, are arranged in a 5×5 array, which makes up a 2 inch by 2 inch cooler. Each cooling element has two manifold nozzles directing air at it, for a total of 50 nozzles in the manifold 200.

As shown in the exemplary design of FIG. 10B, cool air (blue arrows) 10 enters from one side (the left side) and is directed to the nozzles 210 to form jets of cool air directed at the cooler. Warm air (red arrows) 20 returns from the cooler and is exhausted through the openings 220 in the manifold 200 to the other side (the right side). Cool air channels (which include the nozzles 210) in the manifold 200 taper inward (to help deliver the cool air to the cooler more efficiently) while warm air channels (which include the openings 220) taper outward (to help exhaust the warm air from the cooler more efficiently).

The manifold can be manufactured in a number of ways (for example, injection molded or machined) and from a number of materials (e.g., metal or plastic).

Figure 11:
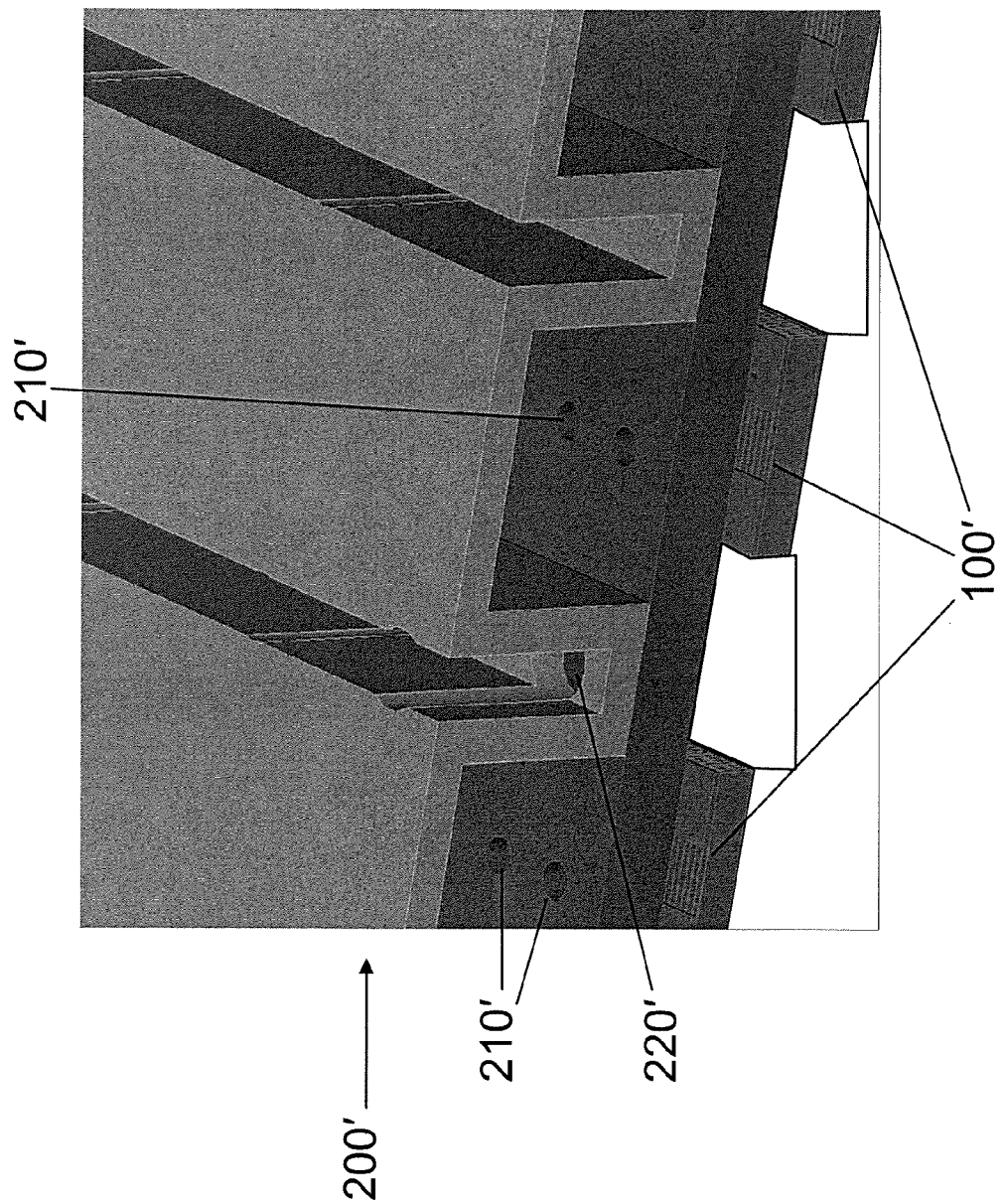
FIG. 11 is an illustration of the exemplary coolers of FIG. 4 shown with a manifold according to another exemplary embodiment of the present invention.

FIG. 11 is an illustration of the exemplary coolers 100' of FIG. 4 shown with a manifold 200' according to another exemplary embodiment of the present invention. In the illustrated example of FIG. 11, coolers 100' are arranged in staggered rows, with spaces in between. The coolers 100' are separated from the manifold 200' by, for example, 0.05 inches.

The manifold 200' includes cool air channels (with nozzles 210') for delivering jets of cool air to the coolers 100'. The configuration of the nozzles 210' corresponds to the receiving points (exposed fins) of the coolers 100'. The manifold 200' also includes warm air channels (with openings 220') for exhausting the warm air exiting the sides of the coolers 100'. The configuration of the openings 220' corresponds to the spaces between the rows of coolers 100'.

Figure 12:
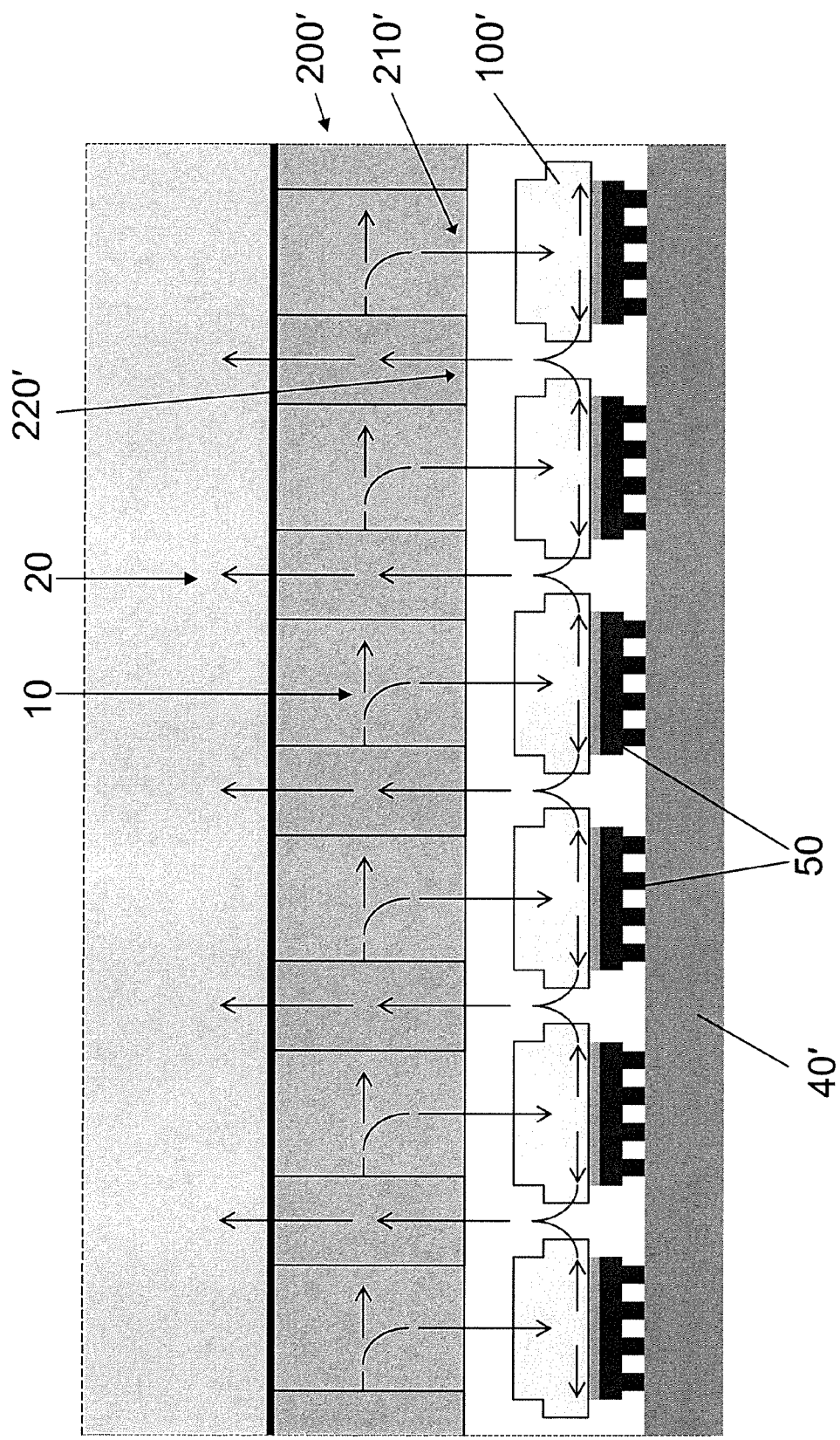
FIG. 12 illustrates an operation of the exemplary manifold of FIG. 11 with the example coolers and heat sources of FIG. 5.

FIG. 12 illustrates an operation of the exemplary manifold 200' of FIG. 11 with the example coolers 100' and heat sources 50 of FIG. 5. FIG. 12 is a widthwise view of six rows of computer chips 50, each with a cooler 100' deployed on them. The computer chips 50 are mounted on a circuit board 40'. Cool air 10 is delivered under sufficient pressure in the cool air channels to exit nozzles 210' (corresponding to the receiving points of the coolers 100') as high speed jets of cool air. The coolers 100' thus function as both microchannel heat sinks as well as allowing jet impingement cooling to take place at the receiving points in the coolers 100'.

In addition, warm air 20 is exhausted through openings 220' in the manifold 200' corresponding to the space between rows of coolers 100'. The warm air 20 proceeds through the warm air channels of the manifold 200' before exiting out of the top of the manifold 200'. The cool air warms through the jet impingement cooling and heat dissipation with the fins of the coolers 100' (via their corresponding microchannels) before exiting out the sides of the coolers 100'.

Although certain exemplary embodiments of the present invention have been disclosed for illustrative purposes, those skilled in the art will appreciate that various modifications, additions and substitutions are possible, without departing from the scope and spirit of the invention as disclosed in the accompanying claims, and equivalents thereof.

What is claimed is:

1. A gas cooling device for cooling a heat source with a gas that is cooler than the heat source, the gas cooling device comprising:
   a parallel microchannel array cooler comprising:
      a base for transferring heat from the heat source; and
      one or more rows in a widthwise direction, a first row of the one or more rows for receiving a plurality of linearly arranged jets of the gas and comprising fins in a lengthwise direction running a length of the first row and that are separated by evenly spaced microchannels, the fins for dissipating the heat from the base, each of the fins being between two of the evenly spaced microchannels and having a bottom edge adjacent to the base, the bottom edges of the fins each having an indentation to connect the two of the evenly spaced microchannels to create a micro-plenum running the length of the first row in the lengthwise direction between the fins and the base for receiving the plurality of linearly arranged gas jets at a corresponding plurality of linearly arranged receiving points, directing the linearly arranged gas jets along the base in the lengthwise direction, and dispersing the gas to the fins via the evenly spaced microchannels in the widthwise direction, one of the evenly spaced microchannels being between two adjacent ones of the linearly arranged receiving points and for receiving the directed gas through the micro-plenum from each of two corresponding adjacent ones of the linearly arranged gas jets, the gas for transferring the heat from the fins; and a manifold separated from the cooler by an air gap extending across an entirety of a top of the cooler, the manifold comprising:

a plurality of linearly arranged nozzles corresponding to the plurality of linearly arranged gas jets and for delivering the corresponding linearly arranged gas jets to the first row, each of the linearly arranged nozzles for delivering a corresponding one of the linearly arranged gas jets across the air gap to a corresponding one of the linearly arranged receiving points in the micro-plenum; and openings for removing the gas delivered to the cooler.

2. The gas cooling device of claim 1, further comprising a structural cap for protecting the fins from handling damage.

3. The gas cooling device of claim 1, wherein the cooler is monolithic.

4. The gas cooling device of claim 1, wherein the fins comprise notches such that adjacent rows of the one or more rows comprise V-grooves in the lengthwise direction between the adjacent rows, the V-grooves for facilitating removing of the heated gas from the cooler.

5. The gas cooling device of claim 1, wherein the one or more rows comprise a plurality of rows.

6. A gas cooling device for cooling a heat source with a gas that is cooler than the heat source, the gas cooling device comprising:

a parallel microchannel array cooler comprising:
a base for transferring heat from the heat source; and
one or more rows in a widthwise direction, a first row of the one or more rows for receiving a plurality of linearly arranged jets of the gas and comprising fins in a lengthwise direction running a length of the first row and that are separated by evenly spaced microchannels, the fins for dissipating the heat from the base, each of the fins being between two of the evenly spaced microchannels and having a bottom edge adjacent to the base, the bottom edges of the fins each having an indentation to connect the two of the evenly spaced microchannels to create a micro-plenum running the length of the first row in the lengthwise direction between the fins and the base for receiving the plurality of linearly arranged gas jets at a corresponding plurality of linearly arranged receiving points, directing the linearly arranged gas jets along the base in the lengthwise direction, and dispersing the gas to the fins via the evenly spaced microchannels in the widthwise direction, one of the evenly spaced microchannels being between two adjacent ones of the linearly arranged receiving points and for receiving the directed gas through the micro-plenum from each of two corresponding adjacent ones of the linearly arranged gas jets, the gas for transferring the heat from the fins; and a manifold comprising:
a plurality of linearly arranged nozzles corresponding to the plurality of linearly arranged gas jets and for delivering the corresponding linearly arranged gas jets to the first row, each of the linearly arranged nozzles for delivering a corresponding one of the linearly arranged gas jets to a corresponding one of the linearly arranged receiving points in the micro-plenum; and openings for removing the gas delivered to the cooler, wherein the manifold is separated and disconnected from the cooler by a fixed distance.

7. The gas cooling device of claim 6, wherein the fixed distance is between about 25 mils and about 100 mils.

8. The gas cooling device of claim 6, wherein the gas is air.

9. The gas cooling device of claim 6, where the cooler further comprises a structural cap for protecting the fins from handling damage.

10. The gas cooling device of claim 6, wherein the cooler is monolithic.

11. The gas cooling device of claim 6, wherein the fins comprise notches such that adjacent rows of the one or more rows comprise V-grooves in the lengthwise direction between the adjacent rows, the V-grooves for facilitating the removing of the heated gas from the cooler via the openings.

12. The gas cooling device of claim 11, wherein the V-grooves correspond to the openings.

13. The gas cooling device of claim 6, further comprising a plurality of coolers.

14. The gas cooling device of claim 6, wherein the one or more rows comprises a plurality of rows.

* * * * *